(12) United States Patent
Redgrave et al.

(10) Patent No.: US 7,230,869 B1
(45) Date of Patent: Jun. 12, 2007

(54) METHOD AND APPARATUS FOR ACCESSING CONTENTS OF MEMORY CELLS

(76) Inventors: Jason Redgrave, 278 Martens Ave., Mountain View, CA (US) 94040; Herman Schmit, 2919 Simkins Ct., Palo Alto, CA (US) 94303

( * ) Notice: Subject to any disclaimer, the term of this patent is extended or adjusted under 35 U.S.C. 154(b) by 0 days.

(21) Appl. No.: 11/081,870

(22) Filed: Mar. 15, 2005

(51) Int. Cl.
*G11C 7/00* (2006.01)
(52) U.S. Cl. .................................. 365/222; 365/189.01
(58) Field of Classification Search ................. 365/222
See application file for complete search history.

(56) References Cited

U.S. PATENT DOCUMENTS

| | | | | |
|---|---|---|---|---|
| 5,245,575 | A | * | 9/1993 | Sasaki et al. .......... 365/189.12 |
| 5,369,622 | A | * | 11/1994 | McLaury .................... 365/233 |
| 5,532,958 | A | * | 7/1996 | Jiang et al. ................. 365/154 |
| 5,768,178 | A | * | 6/1998 | McLaury .................... 365/149 |
| 6,111,779 | A | | 8/2000 | You |
| 6,134,154 | A | * | 10/2000 | Iwaki et al. ............. 365/189.04 |
| 6,173,379 | B1 | * | 1/2001 | Poplingher et al. ......... 711/165 |
| 6,205,076 | B1 | * | 3/2001 | Wakayama et al. ......... 365/222 |
| 6,326,651 | B1 | | 12/2001 | Manabe |
| 6,724,648 | B2 | | 4/2004 | Khellah et al. |
| 6,809,979 | B1 | * | 10/2004 | Tang .......................... 365/222 |
| 6,903,962 | B2 | | 6/2005 | Nii |
| 6,925,025 | B2 | | 8/2005 | Deng et al. |
| 6,937,535 | B2 | * | 8/2005 | Ahn et al. .................. 365/222 |
| 6,970,374 | B2 | | 11/2005 | Lin |
| 7,027,346 | B2 | | 4/2006 | Houston et al. |
| 2001/0038552 | A1 | | 11/2001 | Ishimaru |

(Continued)

OTHER PUBLICATIONS

U.S. Appl. No. 11/081,874, filed Mar. 15, 2005, Redgrave.

(Continued)

*Primary Examiner*—Son L. Mai
(74) *Attorney, Agent, or Firm*—Stattler Johansen & Adeli LLP

(57) ABSTRACT

The invention relates to accessing contents of memory cells. Some embodiments include a memory structure that has a first cell, a second cell, and a sense amplifier. The first cell stores a first value. The first and second cells are connected to the sense amplifier by one or more bit lines. The sense amplifier receives the first value stored by the first cell by using the one or more bit lines and drives the received first value to the second cell through the one or more bit lines. The receiving and driving occur in a single clock cycle. In some embodiments, the second cell outputs the first value. The memory structure of some embodiments also includes a third cell connected to the sense amplifier by the one or more bit lines. The sense amplifier drives a second value to the third cell while the second cell outputs the first value. Other embodiments include a method for accessing data in a memory structure. The method receives a value stored by a first cell; and drives the received value to a second cell. The receiving and driving occur in a single time period. In some embodiments, the method also includes driving a first value to the second cell in a first time period and driving a second value to a third cell in a second time period. In these embodiments, the second cell outputs the first value during the second time period and the third cell outputs the second value during a third time period.

16 Claims, 6 Drawing Sheets

U.S. PATENT DOCUMENTS

2004/0233758 A1\* 11/2004 Kim et al. .................. 365/222
2005/0128789 A1     6/2005 Houston

OTHER PUBLICATIONS

U.S. Appl. No. 11/081,874, filed Mar. 15, 2005, Redgrave.

"Design for Low Power in Actel Antifuse FPGAs", Actel Application Note, 2000 Actel Corporation, Sep. 2000, pp. 1-8.

Gayasen, A., et al., "Reducing Leakage Energy in FPGAs Using Region-Constrained Placement," *FPGA '04,* Feb. 22-24, 2004, pp. 51-58, ACM, Monterey, California, USA.

\* cited by examiner

Typical sense amplifier

Modified Sense Amplifier

METHOD AND APPARATUS FOR ACCESSING CONTENTS OF MEMORY CELLS

CROSS REFERENCE TO RELATED APPLICATION

This Application is related to U.S. patent application Ser. No. 11/081,874, filed Mar. 15, 2005.

FIELD OF THE INVENTION

The invention relates to method and apparatus for accessing contents of memory cells.

BACKGROUND OF THE INVENTION

In recent years, there has been a proliferation of configurable integrated circuits (IC's). Configurable IC's include configurable circuits, such as configurable logic circuits and configurable interconnect circuits. A configurable circuit typically receives configuration data that "configures" the circuit to perform an operation in a set of operations that it can perform.

In a configurable IC, configuration data is typically stored in memory cells. These memory cells are often arranged in a shallow memory structure (such as one row of disjointed cells). In other words, deeper memory structures (e.g., memory arrays) are typically not used for the memory cells that store configuration data. This is because such memory cells need to continuously output configuration data that they store. However, it is difficult to wire memory cells inside a memory array with the lines that are needed for outputting the stored configuration data, because memory arrays are often already congested with word lines and bit lines for performing read and write operations.

Thus, there is a need in the art for a memory structure that will allow configuration data to be stored in memory arrays, which continuously output stored configuration data.

SUMMARY OF THE INVENTION

The invention relates to accessing contents of memory cells. Some embodiments include a memory structure that has a first cell, a second cell, and a sense amplifier. The first cell stores a first value. The first and second cells are connected to the sense amplifier by one or more bit lines. The sense amplifier receives the first value stored by the first cell by using the one or more bit lines and drives the received first value to the second cell through the one or more bit lines. The receiving and driving occur in a single clock cycle. In some embodiments, the second cell outputs the first value. The memory structure of some embodiments also includes a third cell connected to the sense amplifier by the one or more bit lines. The sense amplifier drives a second value to the third cell while the second cell outputs the first value. Other embodiments include a method for accessing data in a memory structure. The method receives a value stored by a first cell; and drives the received value to a second cell. The receiving and driving occur in a single time period. In some embodiments, the method also includes driving a first value to the second cell in a first time period and driving a second value to a third cell in a second time period. In these embodiments, the second cell outputs the first value during the second time period and the third cell outputs the second value during a third time period.

BRIEF DESCRIPTION OF THE DRAWINGS

The objects, features, and advantages of the invention will be apparent to one skilled in the art, in view of the following detailed description in which.

DETAILED DESCRIPTION OF THE INVENTION

The invention is directed towards method and apparatus for accessing contents of memory cells. In the following description, numerous details are set forth for purpose of explanation. However, one of ordinary skill in the art will realize that the invention may be practiced without the use of these specific details. For instance, the present invention is primarily described below with reference to memory cells that store configuration data. However, the same techniques can easily be applied for other types of memory circuits and/or for storage of other types of data. In other instances, well-known structures and devices are shown in block diagram form in order not to obscure the description of the invention with unnecessary detail.

I. Overview

Some embodiments of the invention provide a memory array for storing configuration data. The memory array includes sets of buffer cells and sets of non-buffer cells. The sets of non-buffer cells store configuration data sets. The buffer cells are used to provide continuous output of different configuration data sets that are stored in different non-buffer cells.

Specifically, to provide a continuous output of a particular configuration data set that is stored in a particular set of non-buffer cells, some embodiments transfer the contents of the particular set of non-buffer cells to a particular set of buffer cells. The particular buffer-cell set then provides a continuous output of the particular configuration data set, through a set of output lines that connect to the particular buffer cell set.

Some embodiments have multiple sets of buffer cells to allow the transfer of at least one configuration data set to be interleaved with the continuous output of at least one other configuration data set. For instance, some embodiments have two buffer cell sets, so that one buffer cell set continuously outputs a first configuration data set of a first non buffer cell set, while another buffer cell set receives a second configuration data set from a second non buffer cell set.

In some embodiments, each buffer cell set connects to a set of output lines that provide the continuous output of the content of the buffer cell set. Also, in some embodiments, the buffer cell sets are arranged along the periphery of the memory array. This arrangement simplifies the accessing of the buffer cells by the output lines that provide the continuous output of the configuration data sets that are stored in the buffer cells.

Figure 1:
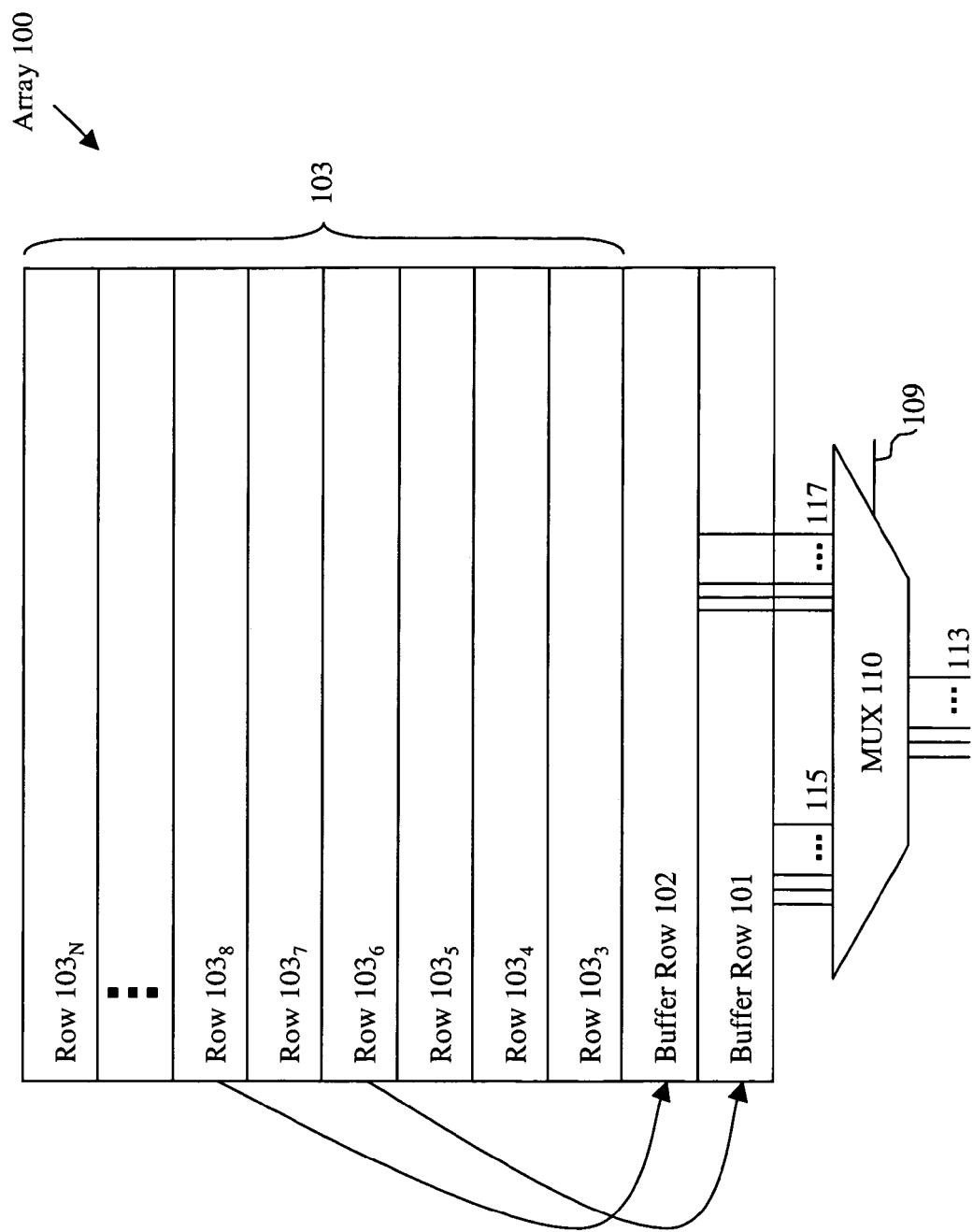
FIG. 1 illustrates an N row memory array.

FIG. 1 illustrates a more detailed embodiment of a memory array 100 of the invention. As shown in this figure, the memory array 100 includes N non-buffer rows $103_3$–$103_N$, two buffer rows 101 and 102, two sets of output lines 115 and 117 for the two buffer rows, a multiplexer 110, and configuration output lines 113.

The buffer and non-buffer rows are "logical" rows in the memory array. In some embodiments, each logical row is a separate physical row in the memory array. In other embodiments, two or more logical rows might occupy an actual physical row in the memory array, while one logical row might occupy more than one physical row in the memory array. However, the buffer rows are typically placed in one or more rows at or close to the periphery of the memory array.

Each non-buffer row stores a set of configuration data. To provide a continuous output of the particular configuration data set that is stored in a particular non-buffer row, the memory array shifts the particular configuration data set to a buffer row 101 or 102. Attached to each buffer row is a set of output lines 115 or 117, which provides a continuous output of the contents of the buffer row. Accordingly, through the output lines that are attached to the buffer row that receives the shifted configuration data set, the memory can provide a continuous output of the configuration data set.

The sets of output lines 115 and 117 are supplied to the multiplexer 110. The memory uses the multiplexer 110 in order to interleave the outputting of the configuration data sets from one buffer row with the shifting of the configuration data sets to the other buffer row. For instance, FIG. 1 illustrates that the configuration data set stored in non-buffer row $103_6$ is initially shifted to buffer row 101. Once shifted, the output lines 115 of the buffer row 101 provide a continuous output of the configuration data set received from the non-buffer row $103_6$. By designating the select signal on the select line 109 of the multiplexer 110, the multiplexer 110 can then be directed to connect the output of the buffer row 101 to the configuration output lines 113. As shown in FIG. 1, a configuration data set can be shifted from the non-buffer row $103_8$ to the buffer row 102, while the buffer row 101 outputs its configuration data set.

II. Implementation of Shifting Between Cells by Using Sense Amplifier

Different embodiments perform the shifting operation between non buffer rows and buffer rows differently. In some embodiments, shifting is accomplished through a modified sense amplifier that allows the reading and the writing of the contents of one cell in the memory array to another cell in the memory array to occur in a single cycle. Such a modified sense amplifier will be described by reference to FIGS. 2–4.

Figure 2:
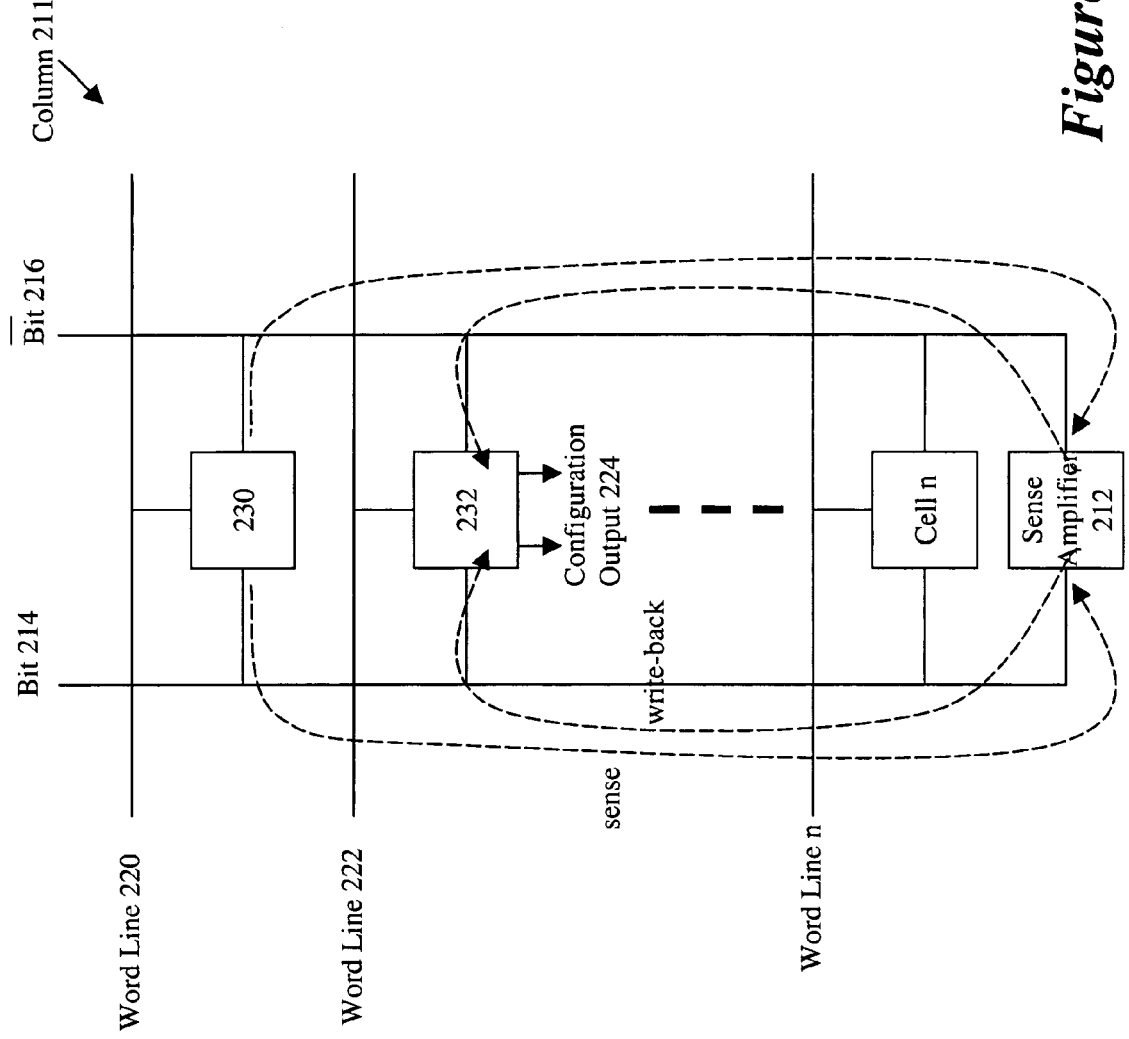
FIG. 2 illustrates one column of memory cells in a memory array.

FIG. 2 illustrates one column 211 of cells in the memory array 100 of FIG. 1.

Column 211 includes a bit line 214, a complement bit line 216, word lines 220 and 222, memory cells 230 and 232, and a sense amplifier 212. Memory cells in an array are typically arranged in columns and rows that are typically accessible through bit lines and word lines. For instance, the cell 230 is located between the bit lines 214 and 216 in the column 211, along the row of cells connected to the word line 220. The word line 220 enables write and/or read operations for the cell 230 by using the sense amplifier 212 tied to the bit lines 214 and 216.

As shown in FIG. 2, the column 211 includes the sense amplifier 212. This sense amplifier 212 allows for the shifting of the contents of one cell to another cell in the column 211 in a single cycle. For instance, during the first part of a given clock cycle, the word line 220 may be activated. When the word line 220 is activated, the sense amplifier 212 may sense a data value stored in the cell 230. Then, during a subsequent part of the same clock cycle, the word line 220 may be de-activated and the word line 222 may be activated instead. When the word line 222 is activated, the sense amplifier 212 may write that last sensed data value (from the cell 230) back along the bit lines 214 and 216 to another cell 232 in the column 211, all in the same clock cycle. As shown in FIG. 2, the cell 232 may be a buffer cell that is wired with output lines 224.

III. Sense Amplifiers Known in the Art Incapable of Shifting

Figure 3:
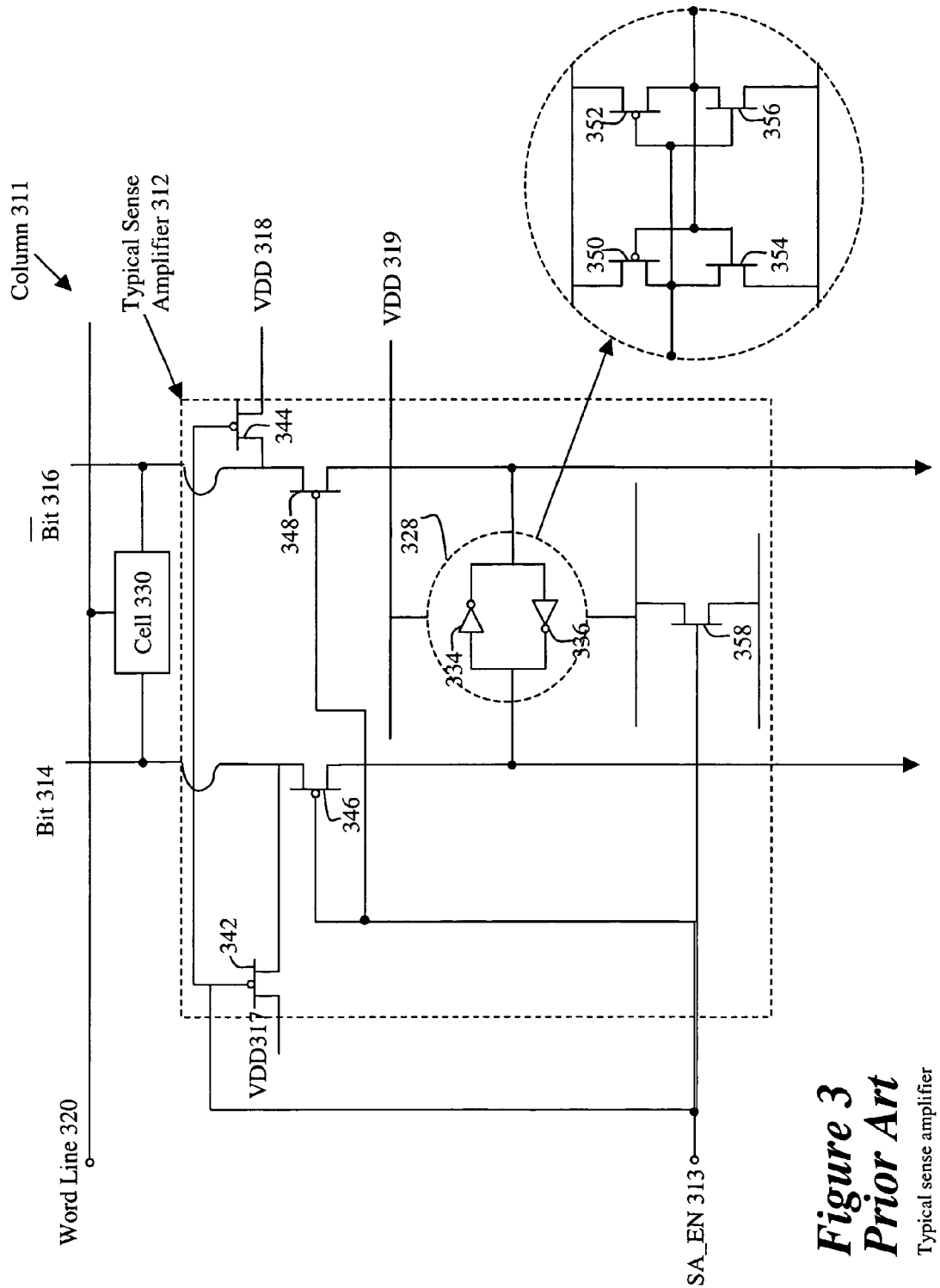
FIG. 3 illustrates a diagram of a typical sense amplifier for one column of memory cells in a memory array, as is known in the art.

The sense amplifiers known in the art do not allow reading and writing in the same cycle. For instance, FIG. 3 illustrates a diagram of one column 311 of memory cells in a memory array that is known in the art. Each cell in the column 311 can be either written to, or read from, in a given cycle. However, to move the contents from one cell to another cell in the column 311, the typical sense amplifier 312 requires multiple cycles (i.e., separate read and write cycles) and external hardware such as an external register for temporary data storage external to the memory array.

As shown in FIG. 3, the typical sense amplifier 312 includes pass gates 342 and 344, read isolation gates 346 and 348, an enable_gate 358, an amplifier stage 328, a sense_amplifier_enable line (SA_EN) 313, and input voltage (VDD) lines 317, 318, and 319.

The sense_amplifier_enable line 313 is coupled to the gate-inputs of the pass gates 342 and 344, the gate-inputs of the read isolation gates 346 and 348, and the gate-input of the enable_gate 358. During a read or write operation, the sense_amplifier_enable line 313 enables the sense amplifier 312 by activating the pass gates 342 and 344, and the read isolation gates 346 and 348, to provide signal and power to the amplifier stage 328, through the bit lines 314 and 316.

The amplifier stage 328 is coupled to the VDD line 319, to the enable_gate 358, and to the bit lines 314 and 316. As shown in FIG. 3, the amplifier stage 328 is typically a pair of cross-coupled CMOS inverters 334 and 336 that are formed by two PMOS transistors 350 and 352, and two NMOS transistors 354 and 356. During a read operation, the amplifier stage 328 senses a value stored in the cell 330 through the bit lines 314 and 316. The amplifier stage 328 then amplifies the sensed value by using power from the input VDD line 319.

The following will describe a read operation of the contents of the cell 330 by using the typical sense amplifier 312. During a read operation, the voltage on the bit lines 314 and 316 are pre-charged to a pre-determined level. Also during a read operation, the read isolation gates 346 and 348 are turned on using the sense_amplifier_enable line 313. When the read isolation gates 346 and 348 are turned on, a cell with an activated word line will modify the pre-charged voltages on the bit lines 314 and 316. In this manner, the cell will pass its contents in the form of voltages along the bit lines 314 and 316, through the read isolation gates 346 and 348, into the amplifier stage 328. For instance, if the word line 320 is activated then the contents of the cell 330 will be "sensed" by the amplifier stage 328 of the sense amplifier 312. The amplifier stage 328 then pushes the values read from the cell 330 to the rails by using the power supplied by the VDD line 319.

Within the same clock cycle, the read isolation gates 346 and 348 are typically then turned off (after sensing) to prevent the amplifier stage 328 from undesirably altering the contents of the memory cells in column 311. However, the VDD line 319 continues to provide power to the amplifier stage 328. Thus, the sensed and amplified values in the amplifier stage 328 will be pushed onto the bit lines 314 and 316 for reading at a location that is external to the column 311 and the memory array 300.

In order to copy the contents of one cell to another cell in a memory array, previously the art required the read operation described above in addition to a separate write operation from an external storage location. The external location is typically a register or other temporary means to hold the contents of a first cell in the array until these contents can be written in a subsequent cycle to a second cell in the memory array. Accordingly, reading and writing back the contents of memory cells in this manner known in the art typically requires multiple clock cycles and external components such as a register.

IV. Modified Sense Amplifier

Some embodiments of the invention save clock cycle time and reduce hardware requirements over the art by shifting the contents of one cell to another cell in a single clock cycle without the need for an external temporary storage location. These embodiments will now be described in relation to FIG. 4.

Figure 4:
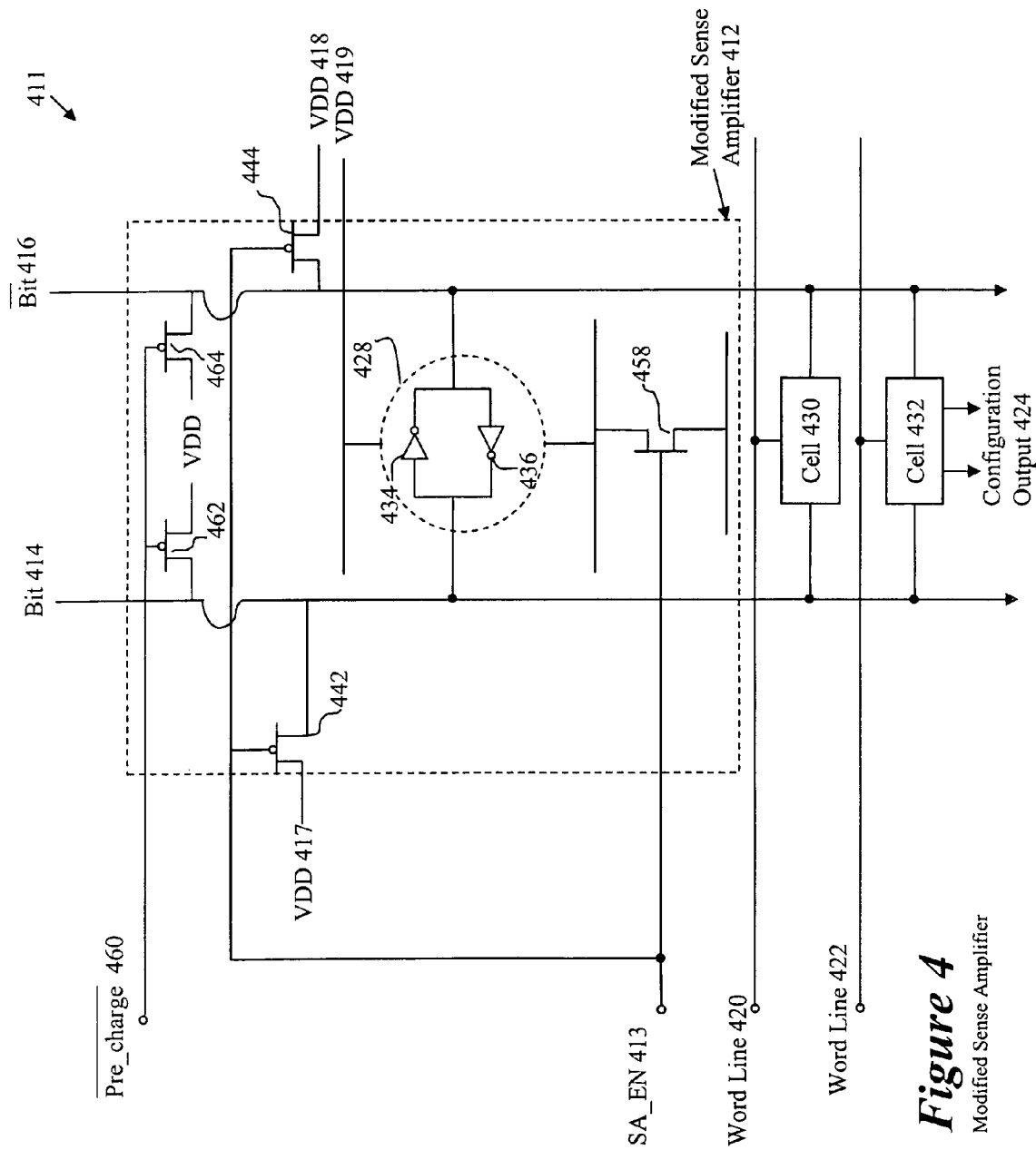
FIG. 4 illustrates a modified sense amplifier for one column of memory cells in a memory array, according to some embodiments of the invention.

FIG. 4 illustrates a column 411 of cells. The column 411 includes a non-buffer cell 430, a buffer cell 432, and a modified sense amplifier 412, all coupled between a bit line 414 and a complement-bit line 416. The non-buffer cell 430 represents a cell in the non-buffer rows $103_3$–$103_8$ illustrated in FIG. 1, while the buffer cell 432 represents a buffer cell in the buffer rows 101–102 illustrated in FIG. 1. The non-buffer cell 430 is tied to the word line 420 while the buffer cell 432 is tied to the word line 422, to enable read and write operations for these cells.

FIG. 4 also illustrates the modified sense amplifier 412, according to some embodiments of the invention. The modified sense amplifier 412 is similar to the typical sense amplifier 312 illustrated in FIG. 3, in that it provides read and write operations for buffer and non-buffer cells in the column 411. However, the modified sense amplifier 412 differs from the typical sense amplifier 312 in that it does not include the read isolation gates 346 and 348. As previously mentioned, the read isolation gates 346 and 348 isolate the typical sense amplifier 312 after the sensing stage of a read operation to prevent unintended write back to the cells in the column 311 illustrated in FIG. 3.

In contrast, the modified sense amplifier 412 shown in FIG. 4 allows the bit lines to be driven high (back up to the rails) after the sensing stage of a read operation. The modified sense amplifier 412 of the illustrated embodiment then uses the bit lines to write the contents of a first cell (the cell that was read) to a second cell, in the same cycle as the read operation for the first cell.

To perform the foregoing, the modified sense amplifier 412 further includes a precharge-bar line 460 coupled to precharge transistors 462 and 464. The precharge transistors 462 and 464 can be PMOS transistors and can be used to supply faster charging to the bit lines 414 and 416. Rapid charging of the bit lines may be desired, for example, in order to execute both a read and write operation in the same clock cycle. An example where the modified sense amplifier 412 both reads from the cell 430 and writes to the cell 432 (a "shifting" operation) will now be described.

As previously mentioned for a typical read operation, both bit lines are driven to a predetermined level and then subsequently allowed to graduate toward a value stored in a cell with an activated word line. For instance, after initial pre-charging, the bit line 414 can be pulled high and the complement bit line 416 can be pulled low by the value stored in the cell 430. The precharge-bar line 460 may be used to drive the initial values on these bit lines 414 and 416. The word line 420 can be activated to allow the value of the cell 430 to be sensed and amplified by the amplifier stage 428 through the bit lines 414 and 416. Once the value in the cell 430 is sensed by the amplifier stage 428, the word line 420 and the precharge-bar line 460 can be de-activated.

However, since the modified sense amplifier 412 has no read isolation gates, the value sensed from the cell 430 at the amplifier stage 428 can be driven back along the bit lines 414 and 416 to the memory cells in the column 411. This feedback signal along the bit lines 414 and 416 is similar to the write signal during a typical write operation, where both bit lines are driven high, then one bit line is brought low to write the value on the bit lines into the cell with the activated word line. The word line 422 can be activated to write into the cell 432 the value previously sensed by the amplifier stage 428 (through the bit lines 414 and 416). Moreover, since the buffer cell 432 is wired with the configuration output 424, the shifted contents of the non-buffer cell 430 are immediately available at the configuration output 424 of the buffer cell 432.

V. Shifting can be Performed for Entire Rows of Cells

The process described above can be repeated across all the cells coupled to a given word line to shift an entire first row of cells in a memory array to a second row of cells in the array. The first row can be a non-buffer row such as rows $103_3$–$103_8$ in FIG. 1. The second row can be a buffer row such as rows 101–102 in FIG. 1.

Figure 5:
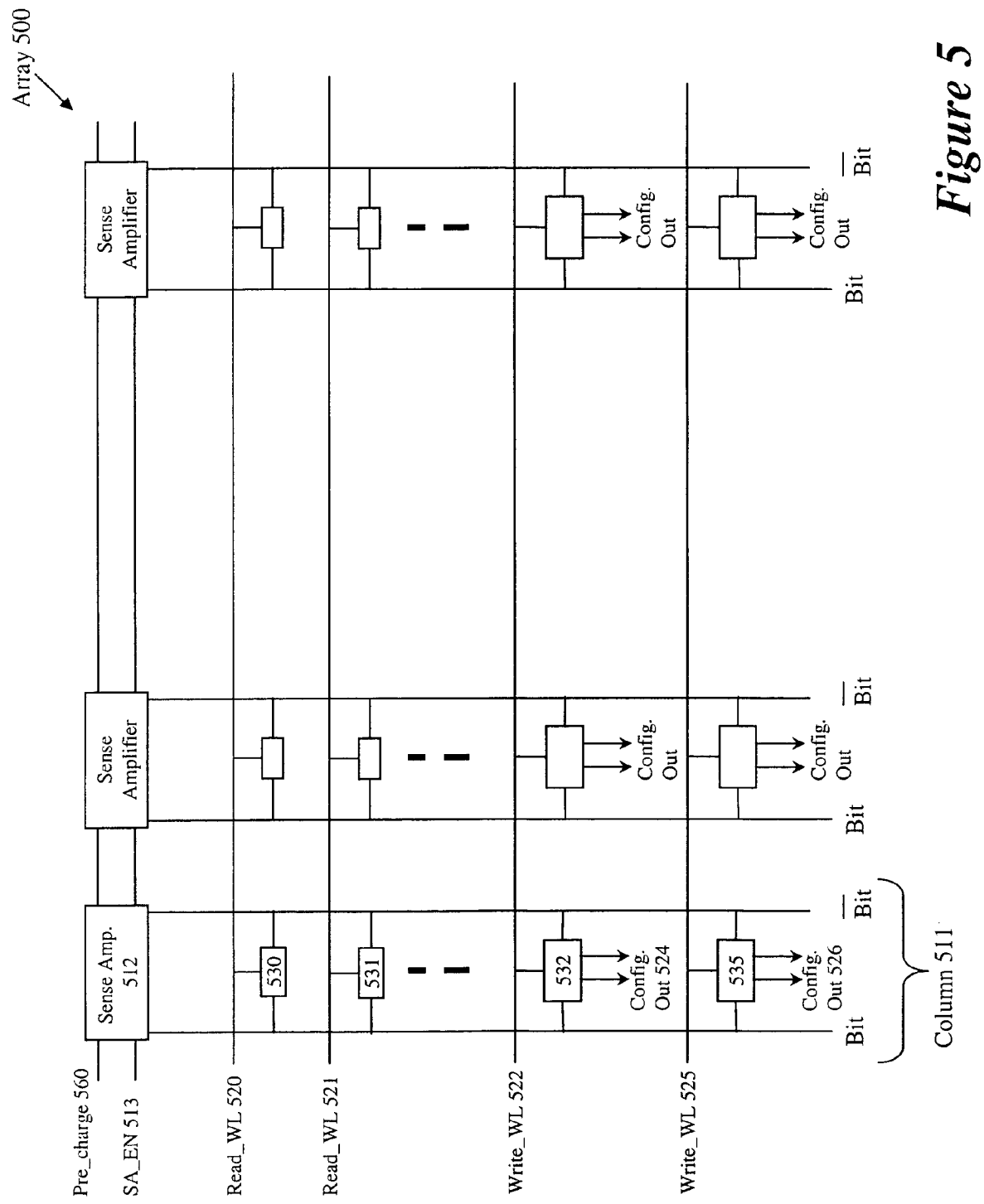
FIG. 5 illustrates several sense amplifiers for several columns of memory cells in a memory array, according to some embodiments of the invention.

For instance, FIG. 5 illustrates several sense amplifiers for several columns of cells in a memory array 500, according to some embodiments of the invention. The memory array 500 includes a precharge line 560, a sense_amplifier_enable line (SA_EN) 513, read_word lines (Read_WL) 520 and 521, write_word lines (Write_WL) 522 and 525, and a cell column 511. The column 511 includes non-buffer cells 530 and 531, and buffer cells 532 and 535. This column 511 illustrates a more detailed embodiment of the column 211 in FIG. 2, and the array 500 illustrates a more detailed embodiment of the array 100 in FIG. 1.

As shown in FIG. 5, the contents of each cell in a first row in the array 500 can be shifted to the cells in a second row in the array 500 by using the method described in relation to FIG. 4. For instance, the read_word line 520 connects a non-buffer cell in each column of the memory array 500, to form a non-buffer row of memory cells in the array 500, while the write_word line 522 connects a buffer cell in each column of the memory array 500, to form a buffer row of cells in the array 500. The read_word line 520 and the write_word line 522 can each be activated in sequence within the same cycle such that the contents of the non-buffer row coupled to the read_word line 520 can be read in a first part of a cycle and written to the buffer row coupled to the write_word line 522, in a second part of the same cycle. The memory array 500 performs this shifting of the contents of the cells in each row by using the modified sense amplifier 512 of some embodiments, as previously described in relation to FIG. 4.

The buffer row cells of some embodiments, such as the buffer cells 532 and 535 in FIG. 5, are wired with configuration output lines to allow their contents to be outputted from the memory array 500, without the need for a read operation. Shifting to and outputting by the separate buffer rows containing the buffer cells 532 and 535, respectively, can be interleaved such that the contents of any given row is outputted by one of the buffer rows in any given cycle. The operation of the memory array 500 will be further described in relation to the timing diagram illustrated in FIG. 6.

VI. Timing Diagram for Interleaved Shifting of Rows

Figure 6:
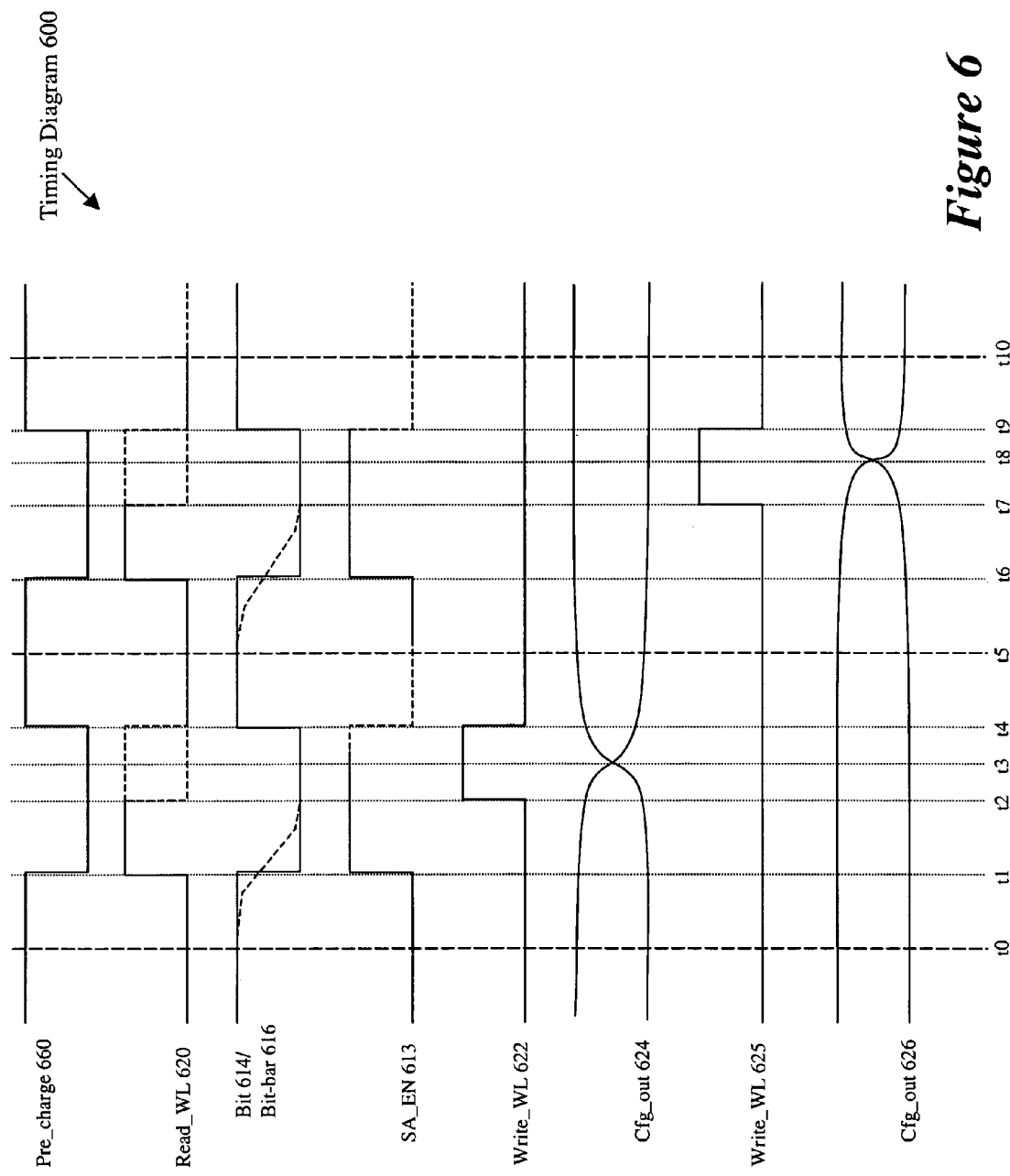
FIG. 6 illustrates a timing diagram according to some embodiments of the invention.

FIG. 6 illustrates a timing diagram 600 according to some embodiments of the invention. The timing diagram 600 includes a pre-charge signal 660, a read_word_line signal (Read_WL) 620, bit signals 614 and 616, a sense_amplifier_enable signal (SA_EN) 613, write_word_line signals (Write_WL) 622 and 625, and configuration_output signals (Cfg_out) 624 and 626.

The pre-charge signal 660 represents the signal through the pre-charge line 560 in FIG. 5. The pre-charge signal 660 allows the bit signals 614 and 616 to be quickly charged, for instance, prior to a read or a write operation.

The read_word_line signal 620 represents the signal through the word line 520 in FIG. 5. The read_word_line signal 620 allows read access to the cells in a row coupled to the word line 520.

The bit signals 614 and 616 represent the signals through the bit lines 514 and 516 in FIG. 5. The bit signals 614 and 616 provide a differential signal for the cells in a column of a memory array and for a sense amplifier coupled to the cells in the column of the memory array.

The sense_amplifier_enable signal (SA_EN) 613 represents the signal through the sense_amplifier_enable line 513 in FIG. 5. The sense_amplifier_enable signal 613 enables the sense amplifier 512 for a read or write operation to, or from, the cells that are coupled to the sense amplifier 512 by the bit lines 514 and 516.

The write_word_line signal (Write_WL) 622 represents a signal through the word line 522 in FIG. 5. The write_word_line signal 622 enables a write operation for the row of cells that are coupled to the word line 522.

The configuration_output signal (Cfg_out) 624 represents a signal through the configuration_output lines 524 in FIG. 5. The configuration_output signal 624 can provide the value stored in the buffer cell 532 (i.e., the "configuration" of the buffer cell 532) to a location outside of the memory array 500.

The write_word_line signal (Write_WL) 625 represents a signal through the word line 525 in FIG. 5. The write_word_line signal 625 enables a write operation for the row of cells that are coupled to the word line 525.

The configuration_output signal (Cfg_out) 626 represents a signal through the configuration_output lines 526 in FIG. 5. The configuration_output signal 626 can provide the value stored in the buffer cell 535 (the "configuration" of the buffer cell 535) to a location outside of the memory array 500.

FIG. 6 further illustrates two clock cycles. In the first clock cycle, indicated by the times t0 to t5, the contents of the non-buffer cell 530 are shifted to the buffer cell 532 in FIG. 5. In the second clock cycle, indicated by the times t5 to t10, the contents of the non-buffer cell 530 are shifted to the buffer cell 535. The following describes the state of each signal shown in FIG. 6 in relation to FIG. 5 during each shifting operation.

As shown in FIG. 6, at time t0 the pre-charge signal 660 and the bit signals 614 and 616, are driven high (have a logical "1") in preparation of a read/write operation. Also at t0, the read_word_line signal 620, the sense_amplifier_enable signal 613, and the write_word_line signals 622 and 625 are low (have a logical "0"). Further at t0, the configuration_output signals 624 and 626 each have one high and one low output at their pairs of output lines 524 and 526.

At t1, the precharge signal 660 is brought low and one of the bit signals 614 and 616 is subsequently pulled lower by the stored voltage that, in some embodiments, represents the contents of the cell 530. In other embodiments, one of the bit signals 614 and 616 is pulled lower by the stored voltage that represents the complement value stored by the cell 530. Also at t1, the read_word_line signal 620 and the sense amplifier_enable signal 613 are driven high (are "enabled"). The foregoing allows the value in the cell 530 to be read or "sensed" by the sense amplifier 512 through the bit lines 514 and 516 in FIG. 5.

At t2, the read_word_line signal 620 is brought low and the write_word_line signal 622 is driven high. This allows the value "sensed" by the sense amplifier 512 at t1 to be written (or "shifted") to the cell 532 shown in FIG. 5. As shown by dashed lines in FIG. 6, previously in the art, the read_word_line signal 620 was driven high for much of the clock cycle from t0 to t5. However, in the described embodiment, the read_word_line signal 620 is driven high for less than the duration of a clock cycle in order to share the clock cycle from t0 to t5 with the write_word_line signal 622.

At t3, while the write_word_line signal 622 is high, the pair of configuration_output signals 624 reverse their values to represent that the contents of the buffer cell 532 have been over-written by the sense amplifier 512 and that the configuration_output lines 524 are now outputting the new value and its complement from the buffer cell 532.

At t4, the precharge signal 660 and the bit signals 614 and 616 are driven high again in preparation of another read/write operation. The sense_amplifier_enable signal 613 and the write_word_line signal 622 are brought low to disable sensing by the sense amplifier 512 and to disable writing to the cell 532, respectively.

At t5, the first clock cycle ends and the second clock cycle begins. The sequence repeats to shift the contents of the non-buffer cell 530 into the buffer cell 535. Thus at t6, the contents of the non-buffer cell 530 are sensed by the sense amplifier 512. At t7, the sensed values are written to the buffer cell 535. At t8, the configuration_output signal 626 reflects the changed contents of the buffer cell 535. At t9, the precharging of the bit lines 514 and 516, represented by the precharge signal 660, resumes in preparation of the next read/write operation. The second cycle concludes at t10, where a third cycle may commence. Sensing (and thus shifting) from the same source cell 530 is illustrated for both the first and second clock cycles to simplify the timing diagram 500. However, one of ordinary skill will recognize that FIG. 5 is representative. Thus, shifting from a source cell other than the cell 530 can occur in either the first or second clock cycle shown in FIG. 5.

VII. Advantages

Shifting

The present invention provides several advantages over the prior art. For instance, the present invention allows shifting of data between cells in a memory array in a single clock cycle. Shifting can occur for all of the cells in a non-buffer row to a buffer row of cells. Given multiple buffer rows, shifting to the multiple buffer rows can be time multiplexed (interleaved) such that the contents of a different non-buffer row can be shifted to a buffer row in every cycle. Thus, the contents of a different row of cells is available at one of the buffer rows at every cycle.

Read-Modify-Write Cycles

A normal modify memory operation requires reading out to a register, modifying the contents of the register, and then writing back to the memory location. Here, the contents of a cell and row of cells could be modified in a single cycle completely within memory. For instance, a bit-mask could be applied to the contents of the source row before the contents are written back to a destination row. Further, if the destination row is a buffer row, then those modified contents would be available immediately at the configuration outputs of that buffer row.

Peripheral Rows

Several rows of the memory array can be designated as buffer rows and wired out for outputting the data contained in these rows. In some embodiments these rows are near the periphery of the memory array. Reading (outputting) from one peripheral row to the output lines and shifting to another peripheral row can occur in the same clock cycle. Since outputting and shifting is effectively time multiplexed across multiple buffer rows, the contents of an entire memory array can be outputted rapidly in succession. Moreover, the memory array is no longer limited in depth because the present invention eliminates the need to wire the internal nodes of the array with additional output lines.

The foregoing has described method and apparatus for accessing contents of memory cells. One of ordinary skill will also recognize that the invention can be embodied in other specific forms without departing from the spirit of the invention, even though the invention has been described with reference to numerous specific details. In view of the foregoing, one of ordinary skill in the art would understand that the invention is not to be limited by the foregoing illustrative details, but rather is to be defined by the appended claims.

What is claimed is:

1. A memory structure comprising:
   a first cell for storing a first value;
   a second cell coupled to said first cell by a set of bit lines; and
   a sense amplifier coupled to said first and second cells by the set of bit lines, said sense amplifier for receiving said first value stored by said first cell through said set of bit lines, and for writing said received first value to said second cell through said set of bit lines;
   wherein said receiving and writing occur in a single clock cycle.

2. The memory structure of claim 1, wherein said set of bit lines comprises a bit line and a complement bit line, said bit line for carrying said first value, said complement bit line for carrying a complement of said first value.

3. The memory structure of claim 1, wherein said second cell further comprises an output line, wherein said output line outputs the value written to said second cell.

4. The memory structure of claim 3, wherein said value is outputted in the same clock cycle as said receiving and writing.

5. The memory structure of claim 1, wherein said memory structure comprises a column of cells in an array of cells, said first and second cells arranged in the column of cells.

6. The memory structure of claim 1 further comprising:
   a first and second set of cells and a set of sense amplifiers,
   wherein said first cell is part of the first set of cells,
   wherein said second cell is part of the second set of cells,
   wherein the set of sense amplifiers is further for writing data from the first set of cells into the second set of cells,
   said second set of cells is connected to a set of output lines that output data written to the second set of cells.

7. The memory structure of claim 6 further comprising:
   a third set of cells,
   wherein the set of sense amplifiers is further for writing data from the third set of cells into the second set of cells.

8. The memory structure of claim 7, wherein said second set of cells serves as a set of buffer cells for outputting the data stored in the first and third sets in an interleaved manner.

9. The memory structure of claim 8, wherein said second set of buffer cells are located near a periphery of said memory structure.

10. The memory structure of claim 1 further comprising:
    a third cell coupled to said sense amplifier by said set of bit lines, wherein said sense amplifier is further for writing a second value to said third cell while said second cell outputs said first value.

11. A method for accessing data in a memory structure, said method comprising:
    receiving a first value stored by a first cell;
    driving said received first value to a second cell in a first time period;
    outputting the first value from the second cell during a second time period;
    driving a second value from a third cell to a fourth cell in the second time period;
    outputting the second value from the fourth cell in a third time period;
    driving a third value to the second cell in the third time period;
    wherein said driving and outputting of said values are interleaved in a manner to allow the memory structure to continuously output data;
    wherein said first and second cells are part of a set of cells arranged in a contiguous array of cells.

12. The method of claim 11, wherein said memory structure comprises a plurality of cells arranged in at least one column, wherein the first, second, third, and fourth cells are arranged in a column, wherein said interleaving of the driving and outputting of said values allow the memory structure to continuously output data from the column.

13. The memory structure of claim 1, wherein said first value is configuration data and the memory structure is a memory used in a configurable integrated circuit having a plurality of configurable circuits that operate based on configuration data.

14. A memory structure comprising:
    a memory array having a plurality of cells arranged in rows and columns;
    a first cell and a second cell arranged in one column;
    the first cell for storing a first value;
    the second cell for receiving, storing and outputting the first value;
    third and fourth cells arranged in the same column as the first and second cells,
    said fourth cell for receiving a second value stored in the third cell while the second cell outputs the first value;
    said second cell for receiving a third value while the fourth cell outputs the second value.

15. The memory structure of claim 14,
    wherein said values are configuration data and the memory structure is a memory used in a configurable integrated circuit having a plurality of configurable circuits that operate based on configuration data;
    wherein the receiving and outputting of said values is interleaved to allow the memory structure to continuously output configuration data from one column in the memory array.

16. The memory structure of claim 15, wherein said second and fourth cells are located near a periphery of said memory structure.

* * * * *